United States Patent
Fujii

(10) Patent No.: US 11,515,700 B2
(45) Date of Patent: Nov. 29, 2022

(54) DRIVE CIRCUIT OF VOLTAGE-CONTROLLED POWER SEMICONDUCTOR ELEMENT

(71) Applicant: FUJI ELECTRIC CO., LTD., Kawasaki (JP)

(72) Inventor: Masanari Fujii, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 288 days.

(21) Appl. No.: 17/038,471

(22) Filed: Sep. 30, 2020

(65) Prior Publication Data

US 2021/0151976 A1 May 20, 2021

(30) Foreign Application Priority Data

Nov. 18, 2019 (JP) .............................. JP2019-207626

(51) Int. Cl.
| | |
|---|---|
| *H02H 3/08* | (2006.01) |
| *H02H 9/02* | (2006.01) |
| *H03K 3/037* | (2006.01) |
| *H02H 1/00* | (2006.01) |
| *H03K 5/01* | (2006.01) |
| *H03K 5/00* | (2006.01) |

(52) U.S. Cl.
CPC ............ *H02H 3/08* (2013.01); *H02H 1/0007* (2013.01); *H03K 3/037* (2013.01); *H03K 5/01* (2013.01); *H03K 2005/00013* (2013.01)

(58) Field of Classification Search
CPC ......... H02H 3/08; H02H 1/0007; H03K 3/037
USPC ....................................................... 361/93.1
See application file for complete search history.

(56) References Cited

U.S. PATENT DOCUMENTS

2012/0013370 A1    1/2012  Mori

FOREIGN PATENT DOCUMENTS

| JP | 2003-134797 A | 5/2003 |
| JP | 2012-023899 A | 2/2012 |
| JP | 2018-033259 A | 3/2018 |

*Primary Examiner* — Jared Fureman
*Assistant Examiner* — Lucy M Thomas
(74) *Attorney, Agent, or Firm* — Rabin & Berdo, P.C.

(57) ABSTRACT

A drive circuit of a voltage-controlled power semiconductor element, including first to fourth switching elements, first and second delay circuits, an overcurrent detection circuit, a slow shutdown detection circuit and a flip-flop. The first switching element turns on upon receiving an off signal. The second switching element is turned on by the first delayed signal generated by the first delay circuit. The third switching element turns on upon receiving a second delayed signal generated by the second delay circuit through the flip-flop. The fourth switching element is turned on by the slow shutdown detection signal generated by the slow shutdown detection circuit. The first to fourth switching elements extract electric charges from the gate terminal of the voltage-controlled power semiconductor element, with first to fourth extracting capabilities, respectively. The first and fourth extracting capabilities are larger than the third extracting capability and smaller than the second extracting capability.

5 Claims, 7 Drawing Sheets

DRIVE CIRCUIT OF VOLTAGE-CONTROLLED POWER SEMICONDUCTOR ELEMENT

CROSS-REFERENCE TO RELATED APPLICATION

This application is based upon and claims the benefit of priority of the prior Japanese Patent Application No. 2019-207626, filed on Nov. 18, 2019, the entire contents of which are incorporated herein by reference.

BACKGROUND OF THE INVENTION

1. Field of the Invention

The embodiments discussed herein relate to a drive circuit of a voltage-controlled power semiconductor element such as an insulated gate bipolar transistor (IGBT).

2. Background of the Related Art

An intelligent power switch (IPS) into which a power semiconductor element that drives a load and its control circuit are integrated is known as a device which exercises switching control of a load such as a motor. With an IPS in which an IGBT is used as a power semiconductor element, an IGBT chip, a freewheeling diode (FWD) chip, and a control integrated circuit (IC) having the function of driving and protection are housed in one package.

The control IC on-controls the IGBT by charging a gate capacitor of the IGBT and off-controls the IGBT by extracting electric charges stored in the gate capacitor. If a current flowing is suddenly stopped to off-control the IGBT, then there is no place for the current to flow to. As a result, a surge voltage may be generated at a collector terminal of the IGBT. Accordingly, usually electric charges stored in the gate capacitor are extracted through two stages (see, for example, Japanese Laid-open Patent Publication No. 2012-23899).

According to Japanese Laid-open Patent Publication No. 2012-23899, for example, with normal operation in which an abnormality does not occur in the IGBT, two switching elements are turned on at different timings when an off signal for off-controlling the IGBT is inputted. When the two switching elements are turned on, the magnitude of sink currents which the two switching elements may pass at the time of extracting electric charges from the gate capacitor of the IGBT are set to different values (hereinafter capability to pass a current according to the on-state resistance of a switching element will be referred to as "extracting capability"). The switching elements which differ in extracting capability are used and electric charges are extracted at different timings. As a result, the IGBT is shut down by stages. This suppresses the generation of a surge voltage.

Furthermore, with Japanese Laid-open Patent Publication No. 2012-23899, for example, a collector current flowing through the IGBT is indirectly monitored. When an overcurrent state in which the collector current is abnormally high continues for determined time or more, a protective shutdown (soft shutdown) of the IGBT is performed. With the soft shutdown the IGBT is gradually shut down by on-controlling a switching element having extracting capability smaller than extracting capability in a normal shutdown.

A control IC (gate drive circuit) disclosed in Japanese Laid-open Patent Publication No. 2012-23899, for example, performs a soft shutdown to protect the IGBT when the overcurrent state continues for the determined time or more. However, an off signal for off-controlling the IGBT may be inputted depending on the switching cycle of the IGBT while the overcurrent state continues for the determined time. In this case, the IGBT is off-controlled in a state in which an overcurrent is flowing. Accordingly, not a soft shutdown but a hard shutdown of the IGBT is performed. As a result, a higher surge voltage is generated.

SUMMARY OF THE INVENTION

According to an aspect, there is provided a drive circuit of a voltage-controlled power semiconductor element having a gate terminal, through which electric charges stored in a gate capacitor thereof being extractable, the drive circuit receiving an off signal for off-controlling the voltage-controlled power semiconductor element. The drive circuit includes: a first switching element which turns on upon receipt of the off signal, and which is configured to extract the electric charges from the gate terminal of the voltage-controlled power semiconductor element with a first extracting capability; a first delay circuit which outputs a first delayed signal a first predetermined time after the receipt of the off signal; a second switching element which is connected to the first delay circuit, which is turned on by the first delayed signal, and which is configured to extract the electric charges from the gate terminal of the voltage-controlled power semiconductor element, with a second extracting capability larger than the first extracting capability; an overcurrent detection circuit which outputs an overcurrent detection signal upon detecting an overcurrent of the voltage-controlled power semiconductor element; a second delay circuit which is connected to the overcurrent detection circuit, and which outputs a second delayed signal a second predetermined time after receiving the overcurrent detection signal; a flip-flop which is connected to the second delay circuit, and which holds the second delayed signal; a third switching element which is connected to the flip-flop, which is turned on by the second delayed signal received thereby through the flip-flop, which is configured to extract the electric charges from the gate terminal of the voltage-controlled power semiconductor element, with a third extracting capability smaller than the first extracting capability; a slow shutdown detection circuit which is connected to the flip-flop and the overcurrent detection circuit, and which outputs a slow shutdown detection signal at a time when the off signal is received after the slow shutdown detection circuit receives the overcurrent detection signal and before the slow shutdown detection circuit receives the second delayed signal through the flip-flop; and a fourth switching element which is connected to the slow shutdown detection circuit, which is turned on by the slow shutdown detection signal, and which is configured to extract the electric charges from the gate terminal of the voltage-controlled power semiconductor element, with a fourth extracting capability larger than the third extracting capability and smaller than the second extracting capability.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Embodiments will now be described in detail by reference to the accompanying drawings with an IPS using an IGBT as a voltage-controlled power semiconductor element taken as an example. Components in figures which are indicated by the same numerals are the same.

First Embodiment

Figure 1:
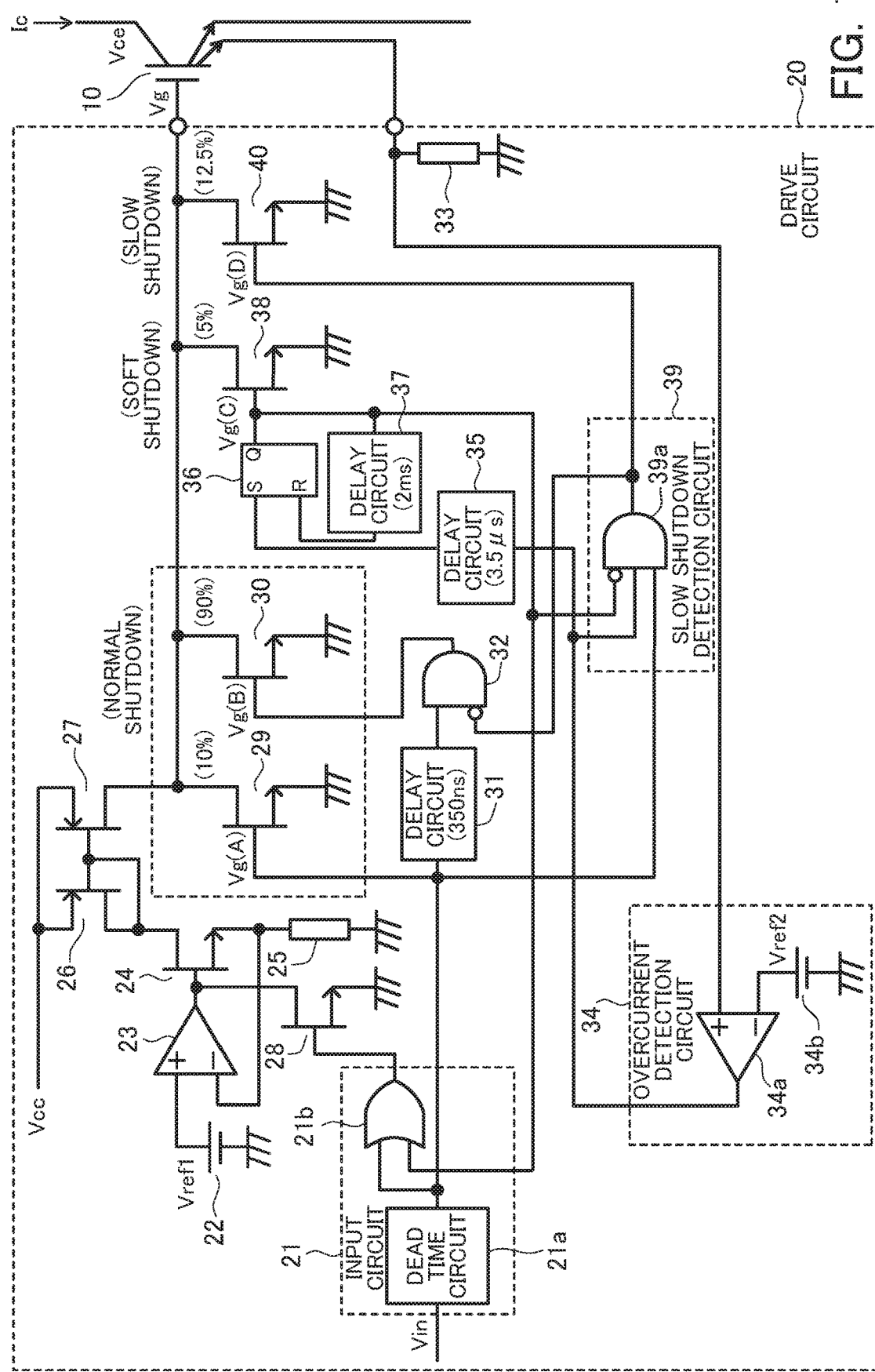
FIG. 1 is a circuit diagram illustrative of a drive circuit of an IGBT according to a first embodiment.
Figure 2:
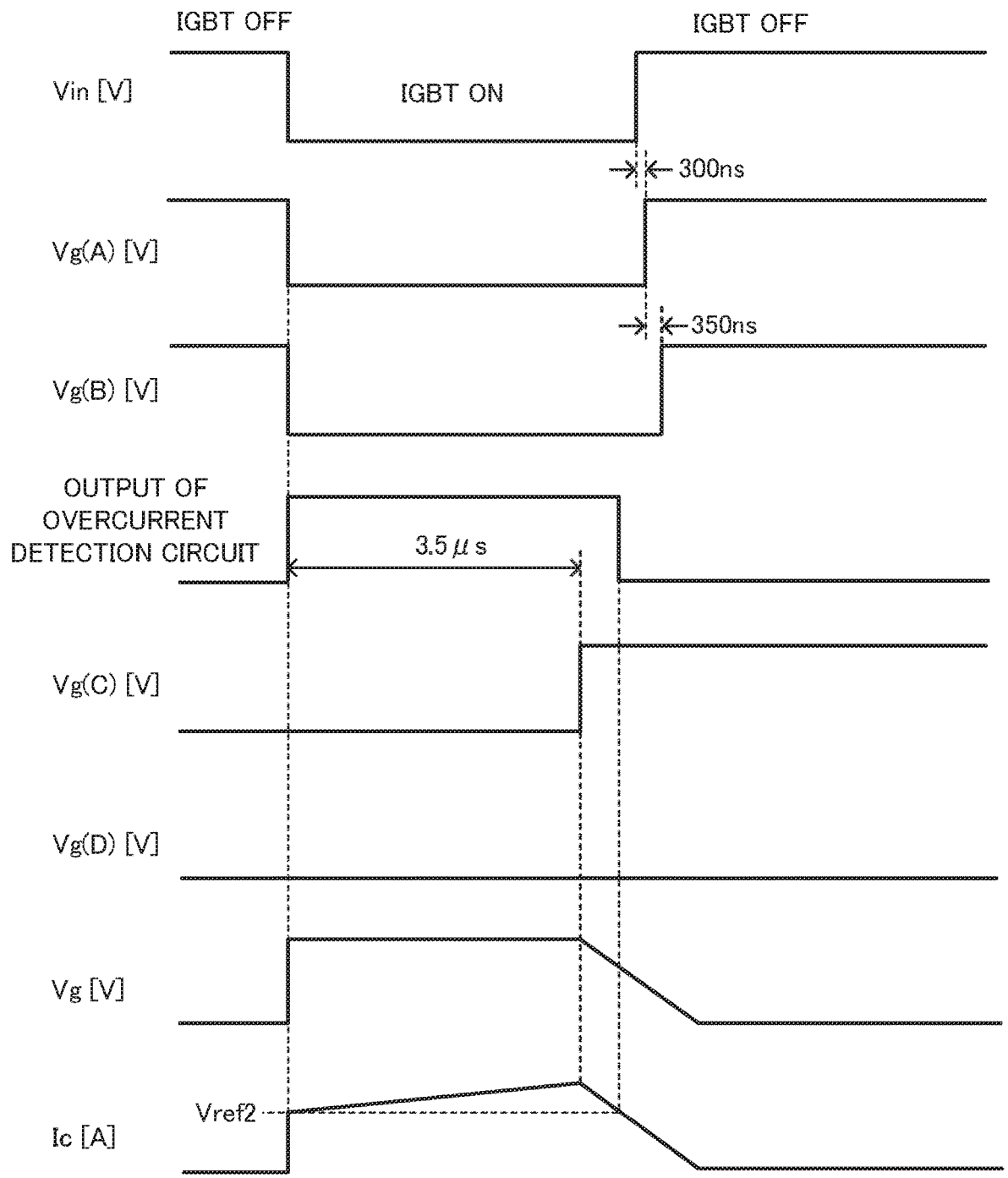
FIG. 2 is a timing chart illustrative of the operation of the drive circuit in a soft shutdown.
Figure 3:
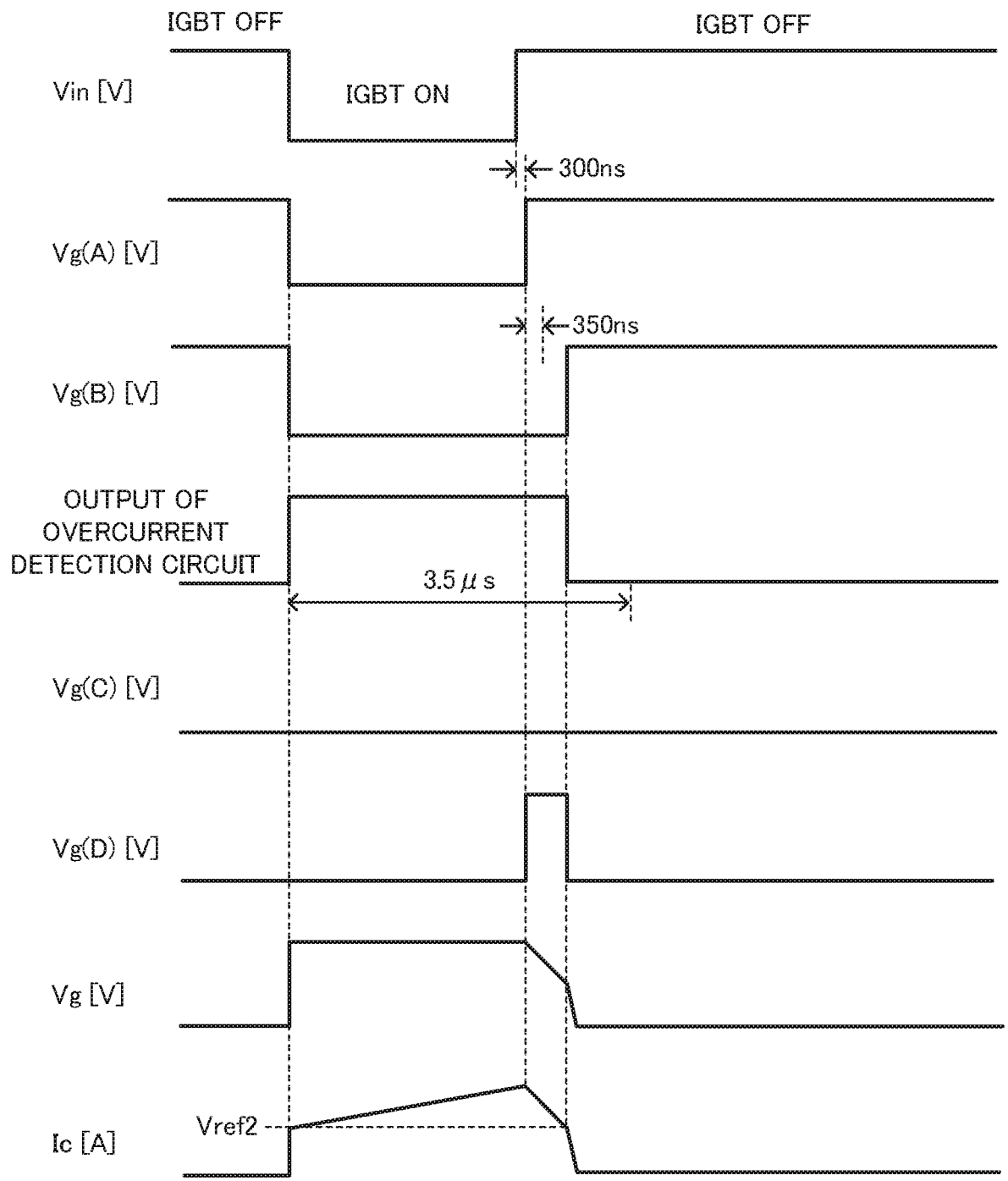
FIG. 3 is a timing chart illustrative of the operation of the drive circuit in a slow shutdown.
Figure 4:
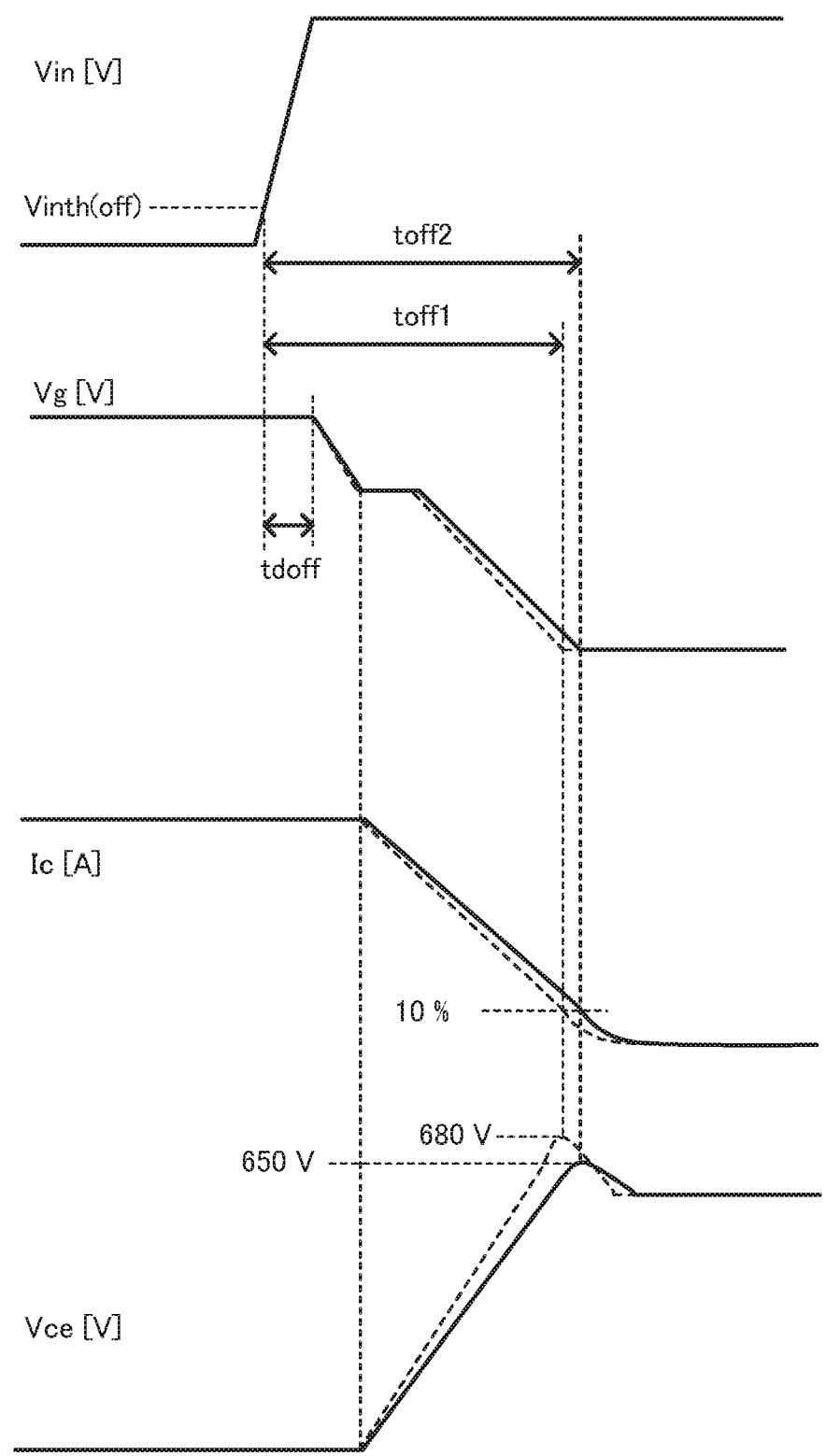
FIG. 4 illustrates operational waveforms of the IGBT at slow shutdown time.

FIG. 1 is a circuit diagram illustrative of a drive circuit of an IGBT according to a first embodiment. FIG. 2 is a timing chart illustrative of the operation of the drive circuit in a soft shutdown. FIG. 3 is a timing chart illustrative of the operation of the drive circuit in a slow shutdown. FIG. 4 illustrates operational waveforms of the IGBT at slow shutdown time.

FIG. 1 illustrates an IGBT 10 and a drive circuit 20 which drives the IGBT 10. The IGBT 10 and a sense IGBT are integrally formed so as to indirectly detect a collector current. Furthermore, an FWD (not illustrated) is connected in inverse parallel with the IGBT 10. The drive circuit 20 is formed as an IC. The IGBT 10, the FWD, and the drive circuit 20 are housed in one package and make up an IPS.

The drive circuit 20 includes an input circuit 21 to which a control signal Vin for turning on or off the IGBT 10 is inputted. The input circuit 21 includes a dead time circuit 21a and an OR circuit 21b. When the control signal Vin which gives instructions to turn off the IGBT 10 is inputted, the dead time circuit 21a delays the timing at which the IGBT 10 is turned off, for example, for 300 nanoseconds (ns). When a signal for turning off the IGBT 10 is inputted from the dead time circuit 21a to one input terminal of the OR circuit 21b or when a soft shutdown is performed at the time of turning on the IGBT 10, the OR circuit 21b outputs a signal which bars the generation of a gate voltage Vg of the IGBT 10.

The drive circuit 20 includes an on-control circuit which turns on the IGBT 10. The on-control circuit includes a transconductance amplifier which generates a constant current, a current mirror circuit which supplies the constant current generated to a gate terminal of the IGBT 10, and a switching element which bars the generation of a current. The transconductance amplifier includes a reference voltage source 22, an operational amplifier 23, an n-channel metal-oxide-semiconductor field-effect transistor (MOSFET) (hereinafter referred to as an NMOS transistor) 24, and a resistor 25. The current mirror circuit includes p-channel MOSFETs (hereinafter referred to as PMOS transistors) 26 and 27. The switching element is an NMOS transistor 28.

In the on-control circuit, a positive electrode terminal of the reference voltage source 22 which outputs a reference voltage Vref1 is connected to a non-inverting input terminal of the operational amplifier and a negative electrode terminal of the reference voltage source 22 is connected to ground. An output terminal of the operational amplifier 23 is connected to a gate terminal of the NMOS transistor 24 and a source terminal of the NMOS transistor 24 is connected to an inverting input terminal of the operational amplifier 23 and one terminal of the resistor 25. The other terminal of the resistor 25 is connected to the ground. A drain terminal of the NMOS transistor 24 is connected to a drain terminal and a gate terminal of the PMOS transistor 26 included in the current mirror circuit, and a source terminal of the PMOS transistor 26 is connected to a line of a power source Vcc. The gate terminal of the PMOS transistor 26 is also connected to a gate terminal of the PMOS transistor 27 and a source terminal of the PMOS transistor 27 is connected to the line of the power source Vcc. A drain terminal of the PMOS transistor 27 is connected to the gate terminal of the IGBT 10. The output terminal of the operational amplifier 23 is also connected to a drain terminal of the NMOS transistor 28. A source terminal of the NMOS transistor 28 is connected to the ground and a gate terminal of the NMOS transistor 28 is connected to an output terminal of the OR circuit 21b included in the input circuit 21.

In the on-control circuit a constant current proportional to the reference voltage Vref1 is generated when the NMOS transistor 28 is off-controlled. The constant current is supplied to the gate terminal of the IGBT 10. That is to say, the operational amplifier 23 controls the NMOS transistor 24 so that a voltage across the terminals of the resistor 25 generated as a result of a current flowing through the resistor 25 will be equal to the reference voltage Vref1. As a result, a drain current having a value determined by the voltage value of the reference voltage Vref1 and the resistance value of the resistor 25 flows through the NMOS transistor 24. A current proportional to the drain current of the NMOS transistor 24 is supplied via the current mirror circuit made up of the PMOS transistors 26 and 27 to the gate terminal of the IGBT 10 as a charging current (source current). A gate capacitor of the IGBT 10 is charged with the current supplied to the gate terminal of the IGBT 10. When the gate voltage Vg at the gate terminal of the IGBT 10 exceeds an on-state threshold voltage of the IGBT 10, the IGBT 10 is turned on.

The NMOS transistor 28 connected to the output terminal of the operational amplifier 23 receives from the OR circuit 21b of the input circuit 21 a signal which bars the generation of the gate voltage Vg of the IGBT 10, and is on-controlled. As a result, the NMOS transistor 24 is off-controlled and the drain current of the NMOS transistor 24 becomes zero.

An off-control circuit which turns off the IGBT 10 includes NMOS transistors 29 and 30 each of which functions as a switching element, a delay circuit 31 which outputs a delayed signal obtained by delaying an input signal, for example, for 350 ns, and an AND circuit 32. A gate terminal of the NMOS transistor 29 is connected to an output terminal of the dead time circuit 21a of the input circuit 21. A drain terminal of the NMOS transistor 29 is connected to the gate terminal of the IGBT 10 and a source terminal of the NMOS transistor 29 is connected to the ground. The output terminal of the dead time circuit 21a of the input circuit 21 is also connected to an input terminal of the delay circuit 31. An output terminal of the delay circuit 31 is connected to a positive-logic input terminal of the AND circuit 32. An output terminal of the AND circuit 32 is connected to a gate terminal of the NMOS transistor 30. A drain terminal of the NMOS transistor 30 is connected to the gate terminal of the IGBT 10. A source terminal of the NMOS transistor 30 is connected to the ground.

In the off-control circuit electric charges stored in the gate capacitor of the IGBT 10 are extracted by the NMOS transistors 29 and 30 for a normal shutdown. By doing so, the gate voltage is forcedly decreased and the IGBT 10 is turned off. The capability of the off-control circuit to extract electric charges is as follows. It is assumed that when both of the NMOS transistors 29 and 30 are turned on, extracting capability is 100 percent. The extracting capability of the NMOS transistors 29 and are set to 10 percent and 90 percent respectively. Accordingly, when the off-control circuit receives from the input circuit 21 a signal for turning off the IGBT 10, first the NMOS transistor 29 begins to extract electric charges with 10-percent extracting capability. Furthermore, after the elapse of 350 ns the NMOS transistor 30 extracts electric charges with 90-percent extracting capability. Extracting capability is adjusted by the size of the NMOS transistor 29 or 30.

The drive circuit 20 also includes a soft shutdown circuit which detects an overcurrent of the IGBT 10 to protect the IGBT 10. The soft shutdown circuit includes a current detection resistor 33, an overcurrent detection circuit 34, a delay circuit 35, an RS flip-flop 36, a delay circuit 37, and an NMOS transistor 38 which functions as a switching element. One terminal of the current detection resistor 33 is connected to a sense emitter terminal of the sense IGBT included in the IGBT 10 and the other terminal of the current detection resistor 33 is connected to the ground. The overcurrent detection circuit 34 includes a comparator 34a and a reference voltage source 34b. A non-inverting input terminal of the comparator 34a is connected to the one terminal of the current detection resistor 33 and an inverting input terminal of the comparator 34a is connected to a positive electrode terminal of the reference voltage source 34b. A negative electrode terminal of the reference voltage source 34b is connected to the ground. For example, a reference voltage Vref2 of the reference voltage source 34b is set to a value corresponding a voltage detected by the current detection resistor 33 at the time of the IGBT 10 passing a current two to three times the rated current. An output terminal of the comparator 34a is connected to an input terminal of the delay circuit 35 and an output terminal of the delay circuit 35 is connected to a set input terminal of the RS flip-flop 36. An output terminal of the RS flip-flop 36 is connected to a gate terminal of the NMOS transistor 38, an input terminal of the delay circuit 37, and the other input terminal of the OR circuit 21b of the input circuit 21. An output terminal of the delay circuit 37 is connected to a reset input terminal of the RS flip-flop 36. For example, delay time obtained by the delay circuit 35 is set to 3.5 microseconds (ps) and delay time obtained by the delay circuit 37 is set to 2 milliseconds (ms). A drain terminal of the NMOS transistor 38 is connected to the gate terminal of the IGBT 10 and a source terminal of the NMOS transistor 38 is connected to the ground. It is assumed that when both of the NMOS transistors 29 and 30 are turned on, extracting capability is 100 percent. For example, the extracting capability of the NMOS transistor 38 is set to 5 percent and is smaller than the extracting capability (10 percent) of the NMOS transistor 29.

In the soft shutdown circuit the overcurrent detection circuit 34 detects an overcurrent of the IGBT 10. If an overcurrent detection state continues for more than 3.5 μs from the time when the overcurrent detection circuit 34 detects an overcurrent of the IGBT 10, then the delay circuit 35 sets the RS flip-flop 36 and the RS flip-flop 36 keeps a set state. The set RS flip-flop 36 outputs a signal for turning on the NMOS transistor 38. The delay circuit 37 begins delay operation by this signal and the NMOS transistor 28 is on-controlled via the OR circuit 21b of the input circuit 21. By doing so, the generation of the constant current supplied to the gate terminal of the IGBT 10 is stopped. The NMOS transistor 38 for a soft shutdown is on-controlled. As a result, the NMOS transistor 38 extracts electric charges stored in the gate capacitor of the IGBT 10 with 5-percent extracting capability and performs a soft shutdown of the IGBT 10. After the soft shutdown of the IGBT 10 is performed, the RS flip-flop 36 is reset after 2 ms, which is the delay time obtained by the delay circuit 37, after the soft shutdown of the IGBT 10 is begun.

Furthermore, the drive circuit 20 includes a slow shutdown circuit. When a control signal Vin for turning off the IGBT 10 is inputted before an overcurrent of the IGBT 10 is detected and a soft shutdown of the IGBT 10 is performed, the slow shutdown circuit performs a slow shutdown of the IGBT 10. The slow shutdown circuit includes a slow shutdown detection circuit 39 and an NMOS transistor 40 which functions as a switching element. The slow shutdown detection circuit 39 includes an AND circuit 39a. A first positive-logic input terminal of the AND circuit 39a is connected to an output terminal of the overcurrent detection circuit 34 and a second positive-logic input terminal of the AND circuit 39a is connected to the output terminal of the dead time circuit 21a of the input circuit 21. A negative-logic input terminal of the AND circuit 39a is connected to the output terminal of the RS flip-flop 36. An output terminal of the AND circuit 39a is connected to a negative-logic input terminal of the AND circuit 32 and a gate terminal of the NMOS transistor 40. A drain terminal of the NMOS transistor 40 is connected to the gate terminal of the IGBT 10 and a source terminal of the NMOS transistor 40 is connected to the ground. For example, the extracting capability of the NMOS transistor 40 is set to 12.5 percent, is smaller than the extracting capability (90 percent) of the NMOS transistor 30, and is larger than the extracting capability (5 percent) of the NMOS transistor 38.

When the IGBT 10 is turned on, the NMOS transistor 40 in the slow shutdown circuit is off-controlled and the AND circuit 32 permits transferring a delayed signal outputted by the delay circuit 31, regardless of whether or not the overcurrent detection circuit 34 detects an overcurrent. However, if the IGBT 10 is turned off before an overcurrent detection state in which the overcurrent detection circuit 34 detects an overcurrent continues for 3.5 μs which is the delay time obtained by the delay circuit 35, on-controlling the NMOS transistor 30 having large extracting capability is barred and the NMOS transistor 40 for a slow shutdown is on-controlled. As a result, electric charges stored in the gate capacitor of the IGBT 10 are extracted by the NMOS transistor 29 and the NMOS transistor 40 with 22.5-percent (10 percent+12.5 percent) extracting capability. At this time a delayed signal is outputted from the delay circuit 31 350 ns after the NMOS transistor 29 is on-controlled. However, this delayed signal is blocked by the AND circuit 32. Accordingly, the NMOS transistor 30 is not on-controlled.

Normal on operation of the drive circuit 20 will now be described. When the overcurrent detection circuit 34 does not detect an overcurrent, the overcurrent detection circuit 34 outputs a low(L)-level signal. As a result, the delay circuit 35 does not operate and a soft shutdown is not performed. Furthermore, because the L-level signal outputted from the overcurrent detection circuit 34 is inputted to the first positive-logic input terminal of the AND circuit 39a, the slow shutdown detection circuit 39 also outputs an L-level signal. Accordingly, a slow shutdown is not performed.

Soft shutdown operation performed when a load of the IGBT 10 is, for example, short-circuited and the short circuit continues for more than 3.5 μs and slow shutdown operation performed when the IGBT is turned off before the elapse of 3.5 μs after the short circuit will now be described by reference to timing charts of FIGS. 2 and 3 respectively. In FIGS. 2 and 3, a control signal Vin, a gate voltage Vg(A) of the NMOS transistor 29, a gate voltage Vg(B) of the NMOS transistor 30, an output of the overcurrent detection circuit 34, a gate voltage Vg(C) of the NMOS transistor 38, a gate voltage Vg(D) of the NMOS transistor 40, a gate voltage Vg of the IGBT 10, and a collector current Ic of the IGBT 10 are indicated from the top.

First soft shutdown operation illustrated in FIG. 2 will be described. When an L-level control signal Vin is inputted to the input circuit 21 and the IGBT 10 is turned on, the overcurrent detection circuit 34 detects an overcurrent and outputs a high(H)-level overcurrent detection signal. An output signal of the input circuit 21 is at an L level for a period for which the IGBT 10 is on-controlled. As a result, the gate voltages Vg(A) and Vg(B) of the NMOS transistors 29 and 30 for a normal shutdown are at an L level and the NMOS transistors 29 and 30 are off-controlled. During the early stage of the period for which the IGBT 10 is on-controlled, an output signal of the delay circuit 35 is at an L level and the RS flip-flop 36 is in a reset state. Accordingly, the gate voltage Vg(C) of the NMOS transistor 38 for a soft shutdown is at an L level and the NMOS transistor 38 is off-controlled. The output signal of the delay circuit 35 becomes an H level 3.5 μs, which is the delay time obtained by the delay circuit 35, after the overcurrent detection circuit 34 detects the overcurrent. The RS flip-flop 36 is put into a set state, the gate voltage Vg(C) becomes an H level, and the NMOS transistor 38 is on-controlled. At this time the H level of the gate voltage Vg(C) is held by the RS flip-flop 36 until 2 ms, which is the delay time obtained by the delay circuit 37, elapses. Because the gate voltage Vg(D) of the NMOS transistor 40 for a slow shutdown is at an L level, the NMOS transistor 40 is off-controlled. The reason for this is as follows. For the period for which the IGBT 10 is on-controlled, an L-level output signal of the input circuit 21 is inputted to the second positive-logic input terminal of the AND circuit 39a and the AND circuit 39a outputs an L-level signal to the output terminal. This L-level signal corresponds to the gate voltage Vg(D) of the NMOS transistor 40.

Because the NMOS transistors 29, 30, 38, and 40 are in an off state during the early stage of the period for which the IGBT 10 is on-controlled, the gate voltage Vg of the IGBT 10 has an H-level value. Because a current detected by the sense IGBT and proportional to the collector current Ic is larger than a current value corresponding to the reference voltage Vref2, the collector current Ic of the IGBT 10 is in an overcurrent state. The collector current Ic of the IGBT 10 is limited by an external inductance component. However, even if the gate voltage Vg of the IGBT 10 is constant, the collector current Ic of the IGBT 10 continues to increase until it gets saturated.

When the NMOS transistor 38 for a soft shutdown is on-controlled after 3.5 μs, which is the delay time obtained by the delay circuit 35, elapses, the NMOS transistor 28 included in the on-control circuit is on-controlled and the generation of a constant current by the on-control circuit is stopped. As a result, the on-control circuit is stopped and a soft shutdown is begun. Accordingly, the gate voltage Vg and the collector current Ic of the IGBT 10 gradually decrease.

When the collector current Ic detected falls below the current value corresponding to the reference voltage Vref2, the overcurrent detection circuit 34 outputs an L-level signal. However, the gate voltage Vg(C) of the NMOS transistor 38 is held at the H level by the RS flip-flop 36.

When after that an H-level control signal Vin is inputted to the input circuit 21 to turn off the IGBT 10, an output signal of the input circuit 21 becomes an H level after 300 ns, which is dead time set by the dead time circuit 21a, elapses. As a result, the off-control circuit attempts to exercise off-control for a normal shutdown. At this time, however, the soft shutdown has already been begun. Accordingly, the gate voltage Vg and the collector current Ic of the IGBT 10 continue to decrease.

The soft shutdown continues and the gate voltage Vg of the IGBT 10 decreases. When the gate voltage Vg of the IGBT 10 falls below an on-state threshold voltage of the IGBT 10, the collector current Ic becomes zero. The RS flip-flop 36 is put into a reset state 2 ms, which is the delay time obtained by the delay circuit 37, after the RS flip-flop 36 is set. By doing so, the gate voltage Vg(C) of the NMOS transistor 38 for a soft shutdown becomes an L level. Until the gate voltage Vg(C) of the NMOS transistor 38 becomes the L level, the on-control of the NMOS transistor 28 included in the on-control circuit and the NMOS transistor 38 for a soft shutdown continues. Accordingly, even if a control signal Vin for turning on or off the IGBT 10 is inputted to the input circuit 21, the IGBT 10 remains in an off state.

Slow shutdown operation will now be described by reference to FIG. 3. When the IGBT 10 is turned on and the IGBT 10 is turned off before the soft shutdown operation is performed, the slow shutdown operation is performed in a state in which the load of the IGBT 10 is, for example, short-circuited. With the slow shutdown a normal shutdown is not performed when the IGBT 10 is turned off. The gate voltage Vg of the IGBT 10 decreases slowly compared with the normal shutdown.

First an L-level control signal Vin is inputted and the IGBT 10 is turned on. When the overcurrent detection circuit 34 detects an overcurrent, the overcurrent detection circuit 34 outputs an H-level overcurrent detection signal. An output signal of the input circuit 21 is at an L level for a period for which the IGBT 10 is turned on. As a result, the gate voltages Vg(A) and Vg(B) of the NMOS transistors 29 and 30 for a normal shutdown are at an L level and the NMOS transistors 29 and 30 are off-controlled. The gate voltage Vg(C) of the NMOS transistor 38 for a soft shutdown does not become an H level during a period of the slow shutdown operation. Therefore, the NMOS transistor 38 for a soft shutdown remains off-controlled. Furthermore, the L-level output signal of the input circuit 21 is inputted to the second positive-logic input terminal of the AND circuit 39a of the slow shutdown detection circuit 39 and the AND circuit 39a outputs an L-level output signal. Accordingly, the NMOS transistor 40 for a slow shutdown is also off-controlled.

When the control signal Vin becomes an H level in 3.5 μs, which is the delay time obtained by the delay circuit 35, and switching to off-control of the IGBT 10 is performed, an output signal of the input circuit 21 becomes an H level after the elapse of 300 ns which is the dead time. As a result, the gate voltage Vg(A) of the NMOS transistor 29 for a normal shutdown becomes an H level and the NMOS transistor 29 is on-controlled. At the same time the H-level output signal of the input circuit 21 is inputted to the second positive-logic input terminal of the AND circuit 39a of the slow shutdown detection circuit 39. At this time, the overcurrent detection circuit 34 outputs an H-level overcurrent detection signal and the RS flip-flop 36 outputs an L-level signal. Accordingly, the AND circuit 39a outputs an H-level slow shutdown detection signal. As a result, the gate voltage Vg(D) of the NMOS transistor 40 for a slow shutdown becomes an H level and the NMOS transistor 40 is on-controlled. At this time an H-level signal is inputted to the negative-logic input terminal of the AND circuit 32. Accordingly, transferring a delayed signal of the delay circuit 31 to the gate terminal of the NMOS transistor 30 for a normal shutdown is barred and the NMOS transistor 30 is not on-controlled.

When the operation of the on-control circuit is stopped by on-controlling the NMOS transistor 28 included in the on-control circuit by the H-level output signal of the input circuit 21 and the NMOS transistor 29 for a normal shutdown and the NMOS transistor 40 for a slow shutdown are on-controlled, the gate voltage Vg and the collector current Ic of the IGBT 10 begin to decrease.

When after that the overcurrent detection circuit 34 ceases to detect an overcurrent, an output signal of the overcurrent detection circuit 34 becomes an L level. As a result, the slow shutdown detection circuit 39 outputs an L-level slow shutdown detection signal. By doing so, the NMOS transistor 40 for a slow shutdown is off-controlled and the AND circuit 32 permits transferring a delayed signal outputted by the delay circuit 31. As a result, the NMOS transistor 30 for a normal shutdown is on-controlled. At this time electric charges stored in the gate capacitor of the IGBT 10 are extracted by the NMOS transistors 29 and 30 for a normal shutdown with the maximum extracting capability. Accordingly, the gate voltage Vg and the collector current Ic of the IGBT 10 decrease rapidly.

The operation of the IGBT 10 at slow shutdown time will now be described in detail by reference to operational waveforms illustrated in FIG. 4. In FIG. 4, a control signal Vin, a gate voltage Vg of the IGBT 10, a collector current Ic of the IGBT 10, and a collector-emitter voltage Vce of the IGBT 10 are indicated from the top. Furthermore, in the operational waveforms of the gate voltage Vg of the IGBT 10, the collector current Ic of the IGBT 10, and the collector-emitter voltage Vce of the IGBT 10, a dashed line indicates shutdown operation without a slow shutdown function and a solid line indicates shutdown operation at slow shutdown time.

The control signal Vin makes the transition from an L level at which the IGBT 10 is turned on to an H level at which the IGBT 10 is turned off. When the voltage of the control signal Vin first exceeds an off-state threshold voltage Vinth(off) of the input circuit 21, the dead time circuit 21a starts. After the elapse of the dead time tdoff (=300 ns) set by the dead time circuit 21a, the NMOS transistor 29 for a normal shutdown and the NMOS transistor 40 for a slow shutdown are on-controlled. As a result, the gate voltage Vg of the IGBT 10 decreases.

The gate voltage Vg enters the Miller plateau in the course of the decrease, the collector current Ic decreases, and the collector-emitter voltage Vce increases. Because a charging current flows from the collector via parasitic Miller capacitance to the gate capacitor, a voltage value does not change temporarily in the Miller plateau. After the gate voltage Vg passes the Miller plateau, the gate voltage Vg decreases again.

With the drive circuit 20 turn-off time of the IGBT 10 becomes longer if the control signal Vin switches from an on signal for turning on the IGBT 10 to an off signal for turning off the IGBT 10 in 3.5 µs after the overcurrent detection circuit 34 detects an overcurrent. This turn-off time means a period from the time when the voltage of the control signal Vin exceeds the off-state threshold voltage Vinth(off) to the time when the collector current Ic decreases to 10 percent. If there is no slow shutdown function, then the gate capacitor is discharged with 100-percent extracting capability when the IGBT 10 is turned off in a state in which an overcurrent is flowing. On the other hand, if there is a slow shutdown function, then the gate capacitor is discharged with 22.5-percent extracting capability. As a result, a slope at which the gate voltage Vg decreases is gentle compared with the case where there is no slow shutdown function. Accordingly, turn-off time toff2 obtained in the case where there is a slow shutdown function is longer than turn-off time toff1 obtained in the case where there is no slow shutdown function. If a slope at which the gate voltage Vg decreases is gentle, a surge voltage of the collector-emitter voltage Vce decreases from 680 volts (V) to 650 V in the example of FIG. 4. Furthermore, a surge voltage decreases by as much as 30 V. Therefore, the IGBT 10 is hardly damaged against a surge voltage and a protection circuit as an anti-surge measure becomes needless or is reduced in size.

Second Embodiment

Figure 5:
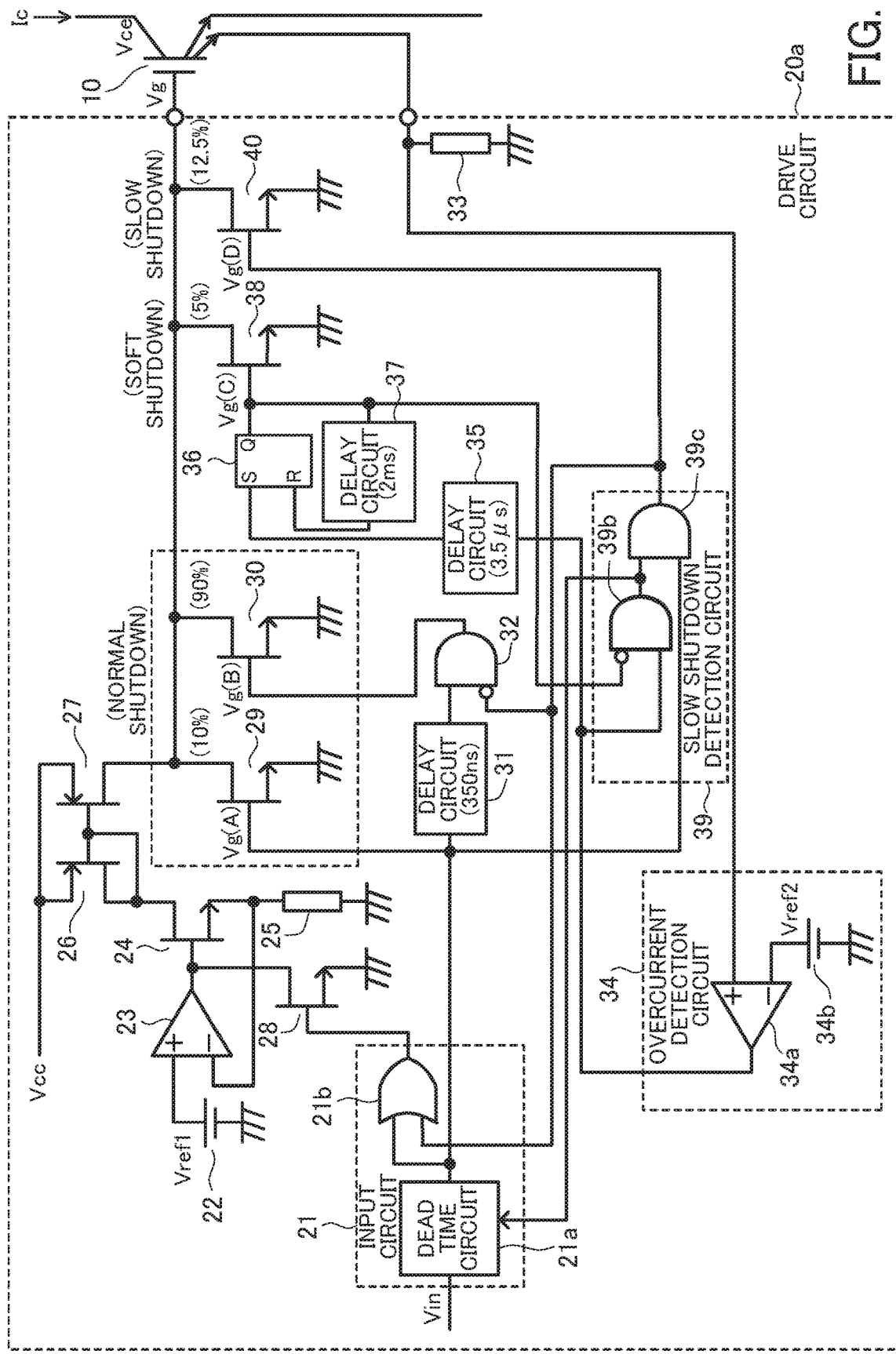
FIG. 5 is a circuit diagram illustrative of a drive circuit of an IGBT according to a second embodiment.
Figure 6:
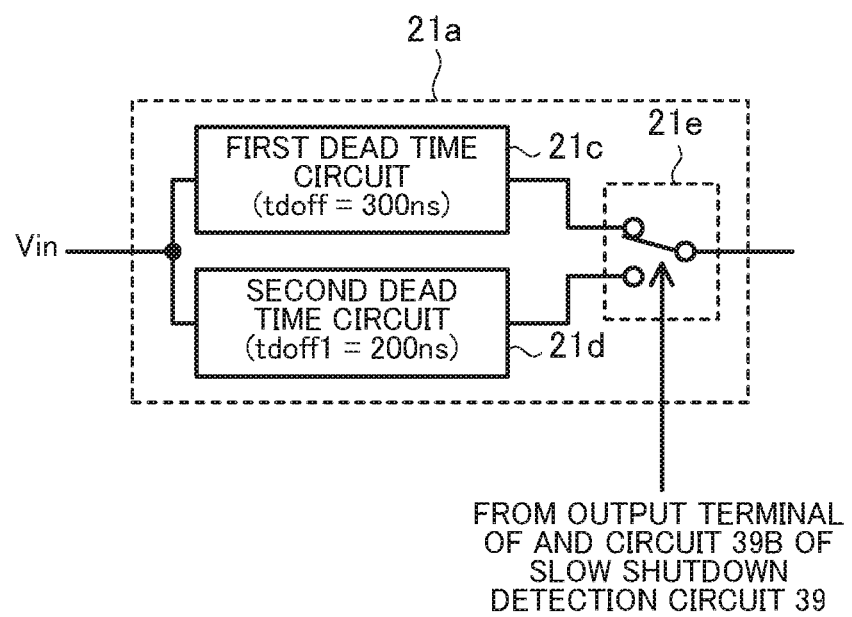
FIG. 6 illustrates an example of the structure of a dead time circuit of an input circuit.
Figure 7:
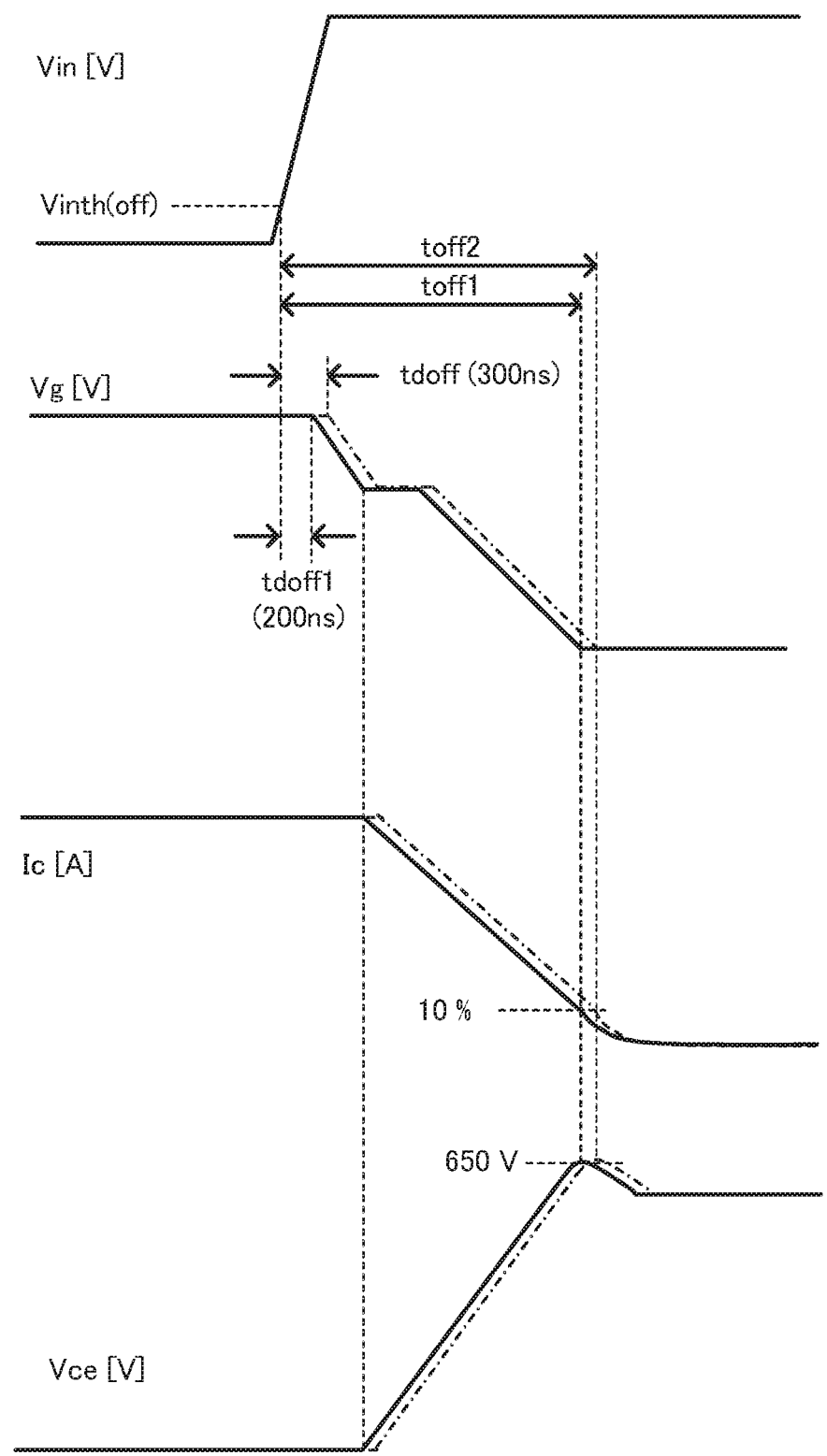
FIG. 7 illustrates operational waveforms of the IGBT at slow shutdown time.

FIG. 5 is a circuit diagram illustrative of a drive circuit of an IGBT according to a second embodiment. FIG. 6 illustrates an example of the structure of a dead time circuit of an input circuit. FIG. 7 illustrates operational waveforms of the IGBT at slow shutdown time. Components in FIG. 5 which are the same as or equivalent to those illustrated in FIG. 1 are marked with the same numerals and detailed descriptions of them will be omitted. Furthermore, in the operational waveforms illustrated in FIG. 7, a dot-dash line indicates a case where a slow shutdown is performed in a state in which dead time switching is not performed. A solid line indicates a case where a slow shutdown is performed in a state in which dead time switching is performed.

A drive circuit 20a of an IGBT 10 according to a second embodiment differs from the drive circuit 20 of the IGBT 10 according to the first embodiment in the structure of an input circuit 21 and a slow shutdown detection circuit 39.

As illustrated in FIG. 6, a dead time circuit 21a of the input circuit 21 includes a first dead time circuit 21c, a second dead time circuit 21d, and a switching circuit 21e. Input terminals of the first dead time circuit 21c and the second dead time circuit 21d are connected to an input terminal of the input circuit 21 which receives a control signal Vin. An output terminal of the first dead time circuit 21c is connected to a normally closed terminal of the switching circuit 21e and an output terminal of the second dead time circuit 21d is connected to a normally open terminal of the switching circuit 21e. A common terminal of the switching circuit 21e is connected to an output terminal of the input circuit 21 and a first input terminal of an OR circuit 21b of the input circuit 21. A control terminal of the switching circuit 21e is connected to an output terminal of an AND circuit 39b of the slow shutdown detection circuit 39.

Dead time tdoff (=300 ns) which is the same as that set by the dead time circuit 21a in the first embodiment is set by the first dead time circuit 21c. Dead time tdoff1 set by the second dead time circuit 21d is shorter than the dead time tdoff set by the first dead time circuit 21c. The dead time tdoff1 set by the second dead time circuit 21d is preferably set to a value obtained by subtracting the differential between the turn-off time toff1 and the turn-off time toff2 indicated in FIG. 4 from the dead time tdoff. In this embodiment the dead time tdoff1 is set to 200 ns.

When an NMOS transistor 40 for a slow shutdown is off-controlled and the overcurrent detection circuit 34 does not detect an overcurrent, the switching circuit 21e selects an output of the first dead time circuit 21c. Furthermore, when the NMOS transistor 40 for a slow shutdown is off-controlled and the overcurrent detection circuit 34 detects an overcurrent, the switching circuit 21e selects an output of the second dead time circuit 21d.

The slow shutdown detection circuit 39 includes the AND circuit 39b and an AND circuit 39c. A positive-logic input terminal of the AND circuit 39b is connected to an output terminal of an overcurrent detection circuit 34 and a negative-logic input terminal of the AND circuit 39b is connected to an output terminal of an RS flip-flop 36. An output terminal of the AND circuit 39b is connected to one input terminal of the AND circuit 39c and a control terminal of the dead time circuit 21a of the input circuit 21. The other input terminal of the AND circuit 39c is connected to an output terminal of the input circuit 21. An output terminal of the AND circuit 39c is connected to a negative-logic input terminal of an AND circuit 32, the other input terminal of the OR circuit 21b of the input circuit 21, and a gate terminal of the NMOS transistor 40 for a slow shutdown.

If a period for which the overcurrent detection circuit 34 detects an overcurrent is shorter than 3.5 µs, then the slow shutdown detection circuit 39 gives the dead time circuit 21a instructions to select the second dead time circuit 21d. Furthermore, when an H-level control signal Vin for turning off the IGBT 10 is inputted if a period for which the overcurrent detection circuit 34 detects an overcurrent is shorter than 3.5 µs, the slow shutdown detection circuit 39 outputs a slow shutdown detection signal. As a result, the generation of a constant current by an on-control circuit is barred and a slow shutdown by the NMOS transistor 40 is begun. At this time the AND circuit 32 bars transferring a delayed signal of a delay circuit 31 so that an NMOS transistor 30 having the largest extracting capability will not be on-controlled.

With the slow shutdown in the first embodiment the turn-off time lengthens from toff1 to toff2. With the drive circuit 20a according to the second embodiment, however, turn-off time returns to toff1. This is the same with a case where there is no slow shutdown function.

With the drive circuit 20a the switching circuit 21e selects the second dead time circuit 21d when an L-level control signal Vin for turning on the IGBT 10 is inputted and the overcurrent detection circuit 34 detects an overcurrent. When in this state the control signal Vin makes the transition to an H-level signal for turning off the IGBT 10, a slow shutdown is begun, as illustrated in FIG. 7, after the elapse of 200 ns which is the dead time. Slow shutdown operation performed after that is the same as the slow shutdown operation in the first embodiment indicated by a dot-dash line in FIG. 7. However, the turn-off time is shortened from toff2 to toff1.

With the drive circuit 20a, as stated above, a decrease in the gate voltage Vg of the IGBT 10 is slow compared with a normal shutdown when the slow shutdown detection circuit 39 operates in a period for which the IGBT 10 is turned off. However, the dead time is shortened from 300 ns to 200 ns. As a result, the turn-off time is equal to the turn-off time toff1 (1.2 µs, for example) obtained by a drive circuit not having a slow shutdown function. The turn-off time at normal shutdown time is equal to the turn-off time at slow shutdown detection time. Accordingly, switching loss of the IGBT 10 at slow shutdown detection time is approximately equal to switching loss of the IGBT 10 at normal shutdown time.

In the above embodiments a case where an IGBT is used as a voltage-controlled power semiconductor element of an IPS is described. However, a voltage-controlled power semiconductor element of an IPS is not limited to an IGBT and a MOSFET may be used.

With a drive circuit of a voltage-controlled power semiconductor element having the above structure, a slow shutdown is performed in place of a hard shutdown, which is a normal shutdown, when an off signal for off-controlling the voltage-controlled power semiconductor element is inputted before a soft shutdown is performed by detecting an overcurrent. As a result, a surge voltage is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A drive circuit of a voltage-controlled power semiconductor element having a gate terminal, through which electric charges stored in a gate capacitor thereof being extractable, the drive circuit receiving an off signal for off-controlling the voltage-controlled power semiconductor element, the drive circuit comprising:

a first switching element which turns on upon receipt of the off signal, and which is configured to extract the electric charges from the gate terminal of the voltage-controlled power semiconductor element with a first extracting capability;

a first delay circuit which outputs a first delayed signal a first predetermined time after the receipt of the off signal;

a second switching element which is connected to the first delay circuit, which is turned on by the first delayed signal, and which is configured to extract the electric charges from the gate terminal of the voltage-controlled power semiconductor element, with a second extracting capability larger than the first extracting capability;

an overcurrent detection circuit which outputs an overcurrent detection signal upon detecting an overcurrent of the voltage-controlled power semiconductor element;

a second delay circuit which is connected to the overcurrent detection circuit, and which outputs a second delayed signal a second predetermined time after receiving the overcurrent detection signal;

a flip-flop which is connected to the second delay circuit, and which holds the second delayed signal;

a third switching element which is connected to the flip-flop, which is turned on by the second delayed signal received thereby through the flip-flop, which is configured to extract the electric charges from the gate terminal of the voltage-controlled power semiconductor element, with a third extracting capability smaller than the first extracting capability;

a slow shutdown detection circuit which is connected to the flip-flop and the overcurrent detection circuit, and which outputs a slow shutdown detection signal at a time when the off signal is received after the slow shutdown detection circuit receives the overcurrent detection signal and before the slow shutdown detection circuit receives the second delayed signal through the flip-flop; and a fourth switching element which is connected to the slow shutdown detection circuit, which is turned on by the slow shutdown detection signal, and which is configured to extract the electric charges from the gate terminal of the voltage-controlled power semiconductor element, with a fourth extracting capability larger than the third extracting capability and smaller than the second extracting capability.

2. The drive circuit of the voltage-controlled power semiconductor element according to claim 1, wherein the slow shutdown detection signal outputted from the slow shutdown detection circuit stops the first delayed signal from being transferred to the second switching element.

3. The drive circuit of the voltage-controlled power semiconductor element according to claim 1, wherein the second delayed signal stops generation of an on signal for on-controlling the voltage-controlled power semiconductor element.

4. The drive circuit of the voltage-controlled power semiconductor element according to claim 1, further comprising:

a first dead time circuit and a second dead time circuit which delay the off signal; and a switching circuit which selects an output of the first dead time circuit when the overcurrent detection signal is not generated, and which selects an output of the second dead time circuit after the overcurrent detection signal is generated and before the second delay circuit outputs the second delayed signal, a dead time set by the second dead time circuit being shorter than a dead time set by the first dead time circuit.

5. The drive circuit of the voltage-controlled power semiconductor element according to claim 4, wherein a difference between the dead time set by the first dead time circuit and the dead time set by the second dead time circuit is equal to a difference between a first turn-off time and a second turn-off time, wherein the first turn-off time is a turn-off time of the voltage-controlled power semiconductor element when the voltage-controlled power semiconductor element is off-controlled, and the first switching element and the second switching element extract the electric charges, and the second turn-off time is the turn-off time of the voltage-controlled power semiconductor element when the voltage-controlled power semiconductor element is off-controlled, and the first switching element and the fourth switching element extract the electric charges in response to the slow shutdown detection signal.

* * * * *